United States Patent
Raghavan et al.

(10) Patent No.: US 7,479,799 B2
(45) Date of Patent: Jan. 20, 2009

(54) OUTPUT BUFFER WITH SWITCHABLE OUTPUT IMPEDANCE

(75) Inventors: Gopal Raghavan, Thousand Oaks, CA (US); Dhruv Jain, Woodland Hills, CA (US)

(73) Assignee: Inphi Corporation, Westlake Village, CA (US)

( * ) Notice: Subject to any disclaimer, the term of this patent is extended or adjusted under 35 U.S.C. 154(b) by 29 days.

(21) Appl. No.: 11/376,593

(22) Filed: Mar. 14, 2006

(65) Prior Publication Data

US 2007/0216445 A1 Sep. 20, 2007

(51) Int. Cl.
*H03K 19/003* (2006.01)

(52) U.S. Cl. .............................. 326/30; 326/86; 326/83; 326/113

(58) Field of Classification Search .................... 326/30, 326/86, 113; 327/108
See application file for complete search history.

(56) References Cited

U.S. PATENT DOCUMENTS

| | | | |
|---|---|---|---|
| 4,707,620 A | 11/1987 | Sullivan et al. | 307/270 |
| 6,448,807 B1 | 9/2002 | Ahsanullah | 326/30 |
| 6,519,173 B2 * | 2/2003 | Funaba et al. | 365/63 |
| 6,690,191 B2 * | 2/2004 | Wu et al. | 326/30 |
| 6,844,754 B2 * | 1/2005 | Yamagata | 326/30 |
| 6,965,529 B2 | 11/2005 | Zumkehr et al. | 365/189.05 |
| 6,980,021 B1 * | 12/2005 | Srivastava et al. | 326/30 |
| 2007/0205805 A1 * | 9/2007 | Kiehl et al. | 326/82 |

OTHER PUBLICATIONS

JEDEC Standard, Definition of the SSTE32882 Registering Clock Driver with Parity for DDR3 RDIMM—Applications; JEDEC Solid State Technology Association. JESDxx-x, Item #104: Nov. 2005: pp. 1-32.

* cited by examiner

*Primary Examiner*—Vibol Tan
(74) *Attorney, Agent, or Firm*—Koppel, Patrick, Heybl & Dawson

(57) ABSTRACT

An output buffer with a switchable output impedance designed for driving a terminated signal line. The buffer includes a drive circuit, and a means for switching the output impedance of the drive circuit between a first, relatively low output impedance when the output buffer is operated in a 'normal' mode, and a second output impedance which is greater than the first output impedance when operated in a 'standby' mode. By increasing the drive circuit's output impedance while in 'standby' mode, power dissipation due to the termination resistor is reduced. When used in a memory system, additional power savings may be realized by arranging the buffer such that the increased impedance in 'standby' mode shifts the signal line voltage so as to avoid the voltage range over which a line receiver's power consumption is greatest.

11 Claims, 4 Drawing Sheets

OUTPUT BUFFER WITH SWITCHABLE OUTPUT IMPEDANCE

BACKGROUND OF THE INVENTION

1. Field of the Invention

This invention relates to the field of output buffers, and particularly to output buffers used to drive terminated signal lines.

2. Description of the Related Art

There are many applications in which output buffers drive respective signal lines to convey data to one or more devices connected to the signal lines. In such applications, it is important that the integrity of the data on the signal lines be maintained, so that it can be accurately detected by the receiving devices.

One such application is a random access memory (RAM) system. Dual-Inline Memory Modules (DIMMs) are the industry-standard platform on which RAM is provided for digital computers. Each DIMM is a printed-circuit board which contains a number of individual RAM integrated circuits (ICs) or "chips." DIMMs typically contain address and/or control registers which distribute data bits to each of the DIMM's RAM chips via signal lines driven by respective output buffers.

A typical DIMM arrangement is shown in FIG. 1a. An output buffer 10 includes a drive circuit 12 which drives a signal line 14. The DIMM includes a number of RAM chips 16; dynamic RAM (DRAM) chips are shown in FIG. 1, though a DIMM can include other RAM types as well. Signal line 14 is routed to an address or control input on each RAM chip.

DIMMs are provided in a variety of configurations. Each DIMM type has an associated set of specifications, promulgated by the industry-supported JEDEC Solid State Technology Association international standards body, which govern the DIMM's configuration and operation. For some DIMM types, the specifications require that each signal line be "terminated"; i.e., that a termination resistor $R_t$ be connected between each signal line and a fixed voltage, denoted in FIG. 1 as V+. Termination resistors serve to improve the signal quality on transmission lines such as signal line 14.

The use of termination resistors in this way can have an undesirable side effect, however, in that they tend to increase the DIMM's power consumption. For example, assuming that the output impedance of drive circuit 12 is ~0 Ω, V+ is 0.75 volts, and $R_t$ is 30 Ω, then the static power dissipation $P_{diss}$ associated with one signal line is:

$P_{diss}=(V+)^2/R_t=18.75$ mW/signal line. There are typically 20-30 signal lines on a DIMM, such that power dissipation due to $R_t$ can be 500 mW or more.

One approach which has been suggested to reduce $P_{diss}$ is to make the output of drive circuit 12 a 'tri-state' output, which presents a high impedance to signal line 14 during a low power or 'standby' mode. This reduces the voltage across $R_t$ to zero, and thus $P_{diss}$ is also reduced to zero. However, this solution may give rise to another problem, which is illustrated in FIGS. 1b and 1c. Signals provided to a DRAM input are typically received by a line receiver 20, which determines the logic state of the signal line by comparing the signal line voltage ($V_D$) with a reference voltage ($V_{ref}$). As shown in FIG. 1c, the power consumed by line receiver 20 is greatest when $V_D$ is equal to $V_{ref}$, and decreases as the difference between $V_D$ and $V_{ref}$ increases. $V_{ref}$ is typically made equal to one-half of the memory system's supply voltage, which is also a preferred voltage for V+. When $V_{ref}=V+$, enabling the 'standby' mode causes $V_D$ to be pulled up to $V_{ref}$ via termination resistor $R_t$. This causes the power consumption of each DRAM line receiver to spike, resulting in a total power consumption which may be unacceptably high.

SUMMARY OF THE INVENTION

An output buffer with a switchable output impedance is presented which overcomes the problems noted above, by reducing power dissipation that would otherwise arise due the termination resistor on a signal line being driven, as well as avoiding undesirable power consumption by signal line receivers such as those found in DRAM chips.

The present output buffer is designed for driving a terminated signal line. The buffer includes a drive circuit, and a means for switching the output impedance of the drive circuit between a relatively low value—typically <20 Ω—when the output buffer is operated in a first, 'normal' mode, and a value greater than the 'normal' value when the output buffer is operated in a second mode such as a low power or 'standby' mode. By increasing the drive circuit's output impedance while in 'standby' mode, power dissipation due to the termination resistor is reduced. Several means for controlling the drive circuit's output impedance are described.

The present output buffer may be advantageously employed in any application for which terminated signal lines need to be driven. The buffer can be particular useful when used in a memory system as described above, such as a DDR3 memory system having signal lines terminated in accordance with applicable JEDEC specifications. In this application, additional power savings may be realized by arranging the buffer such that the increased impedance in low power mode shifts the signal line voltage so as to avoid the voltage range over which a line receiver's power consumption is greatest. When so arranged, a memory system's total power consumption can be significantly reduced.

Further features and advantages of the invention will be apparent to those skilled in the art from the following detailed description, taken together with the accompanying drawings.

DETAILED DESCRIPTION OF THE INVENTION

The present output buffer with switchable output impedance is intended for use driving terminated signal lines, particularly when power consumption is a concern. By controlling the buffer's output impedance, the power consumption of a system employing the buffer can be reduced in comparison with systems which lack this capability.

Though the present buffer is generally applicable to any terminated signal line application, a primary application is in a memory system, in which each buffer drives a respective terminated address or control line routed to multiple RAM chips populating a DIMM memory module. For example, for DIMMs in compliance with the DDR3 specifications promulgated by JEDEC, each address and control line is routed to multiple DRAM chips on the DIMM, and each line is terminated with a termination resistor having a resistance $R_t$. For purposes of illustration, this application is described throughout, though the invention is in no way limited to use with DIMMs.

Figure 2:
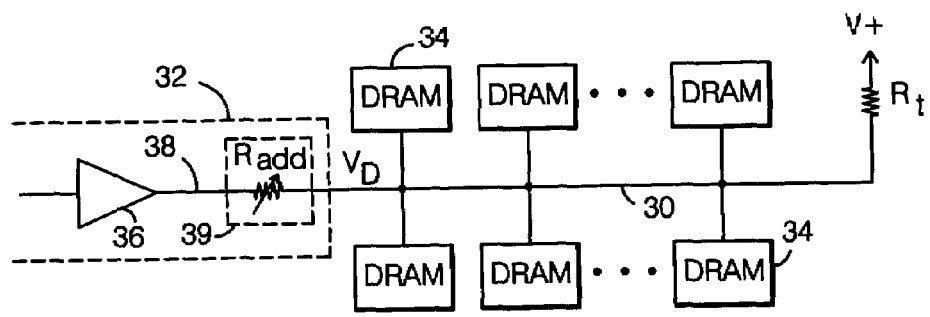
FIG. 2 is a block diagram of an output buffer per the present invention, as it might be employed in a memory system application.

The basic principles of an output buffer per the present invention are illustrated in FIG. 2. A signal line 30 is terminated with a termination resistor having a resistance $R_t$, which is connected between the signal line and a fixed voltage V+. Signal line 30 is driven by an output buffer 32; in a DIMM application as described above, output buffer 32 conveys data bits to an input of each RAM chip 34 on the DIMM via signal line 30.

Output buffer 32 includes a drive circuit 36 which produces an output 38. Buffer 32 also includes a means for switching the output impedance of drive circuit 36 between at least two values. Typically, the buffer is arranged such that the output impedance is switchable between a relatively low impedance (typically <20Ω) when the buffer is operated in a first, 'normal' mode, and an output impedance which is greater than the 'normal' mode value when the buffer is operated in a second, 'standby' mode. The switchable impedance (39) is represented in FIG. 2 with a variable resistance $R_{add}$ connected in series with the output of drive circuit 36, though means other than a series resistance might also be used, as discussed below. Note that, in 'standby' mode, the drive circuit output need not go into a 'tri-state' mode as in the prior art. By making the drive circuit's output impedance switchable as described herein, the drive circuit output may remain at a logic '0' or logic '1' state in 'standby' mode.

Increasing the impedance of the drive circuit output reduces the power dissipation that arises due to the termination resistor. When $R_{add}=0$, static power dissipation $P_{diss}$ is given by:

$$P_{diss}=(V+)^2/R_t$$

Assuming $R_t=30\Omega$ and V+=0.75 volts,
$P_{diss}=(V+)^2/R_t=18.75$ mW/signal line. There are typically 20-30 signal lines on a DIMM, such that $P_{diss}$ due to $R_t$ can be 500 mW or more.

However, when $R_{add}$ is increased to, for example, 100Ω, the equation for $P_{diss}$ becomes:
$P_{diss}=(V+)^2/(R_t+R_{add})=4.33$ mW/signal line. Thus, switching the output impedance of buffer 32 from ~0Ω to ~100Ω reduces static power dissipation to about one-fourth its previous value.

The increase in the drive circuit's output impedance in 'standby' mode also serves to shift the signal line voltage ($V_D$). Using the values for V+, $R_{add}$ and $R_t$ from the example above, during 'standby' mode, the signal line voltage $V_D$ is given by:

$$V_D=(V+ * R_{add})/(R_{add}+R_t)\sim 0.58 \text{ volts.}$$

Figure 1A:
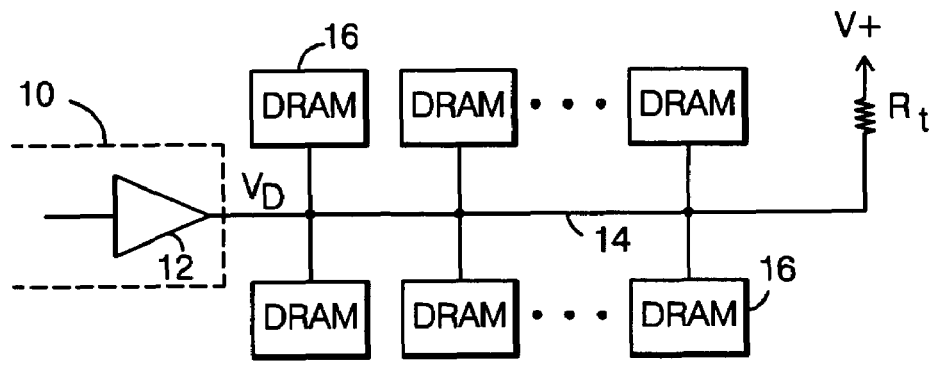
FIG. 1a is a block diagram of a known memory system configuration.
Figure 1B:
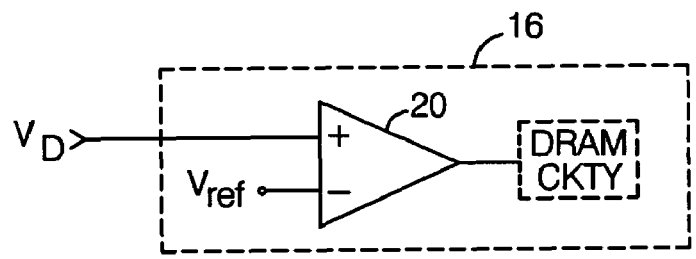
FIG. 1b is a block diagram depicting a DRAM chip which includes a line receiver.
Figure 1C:
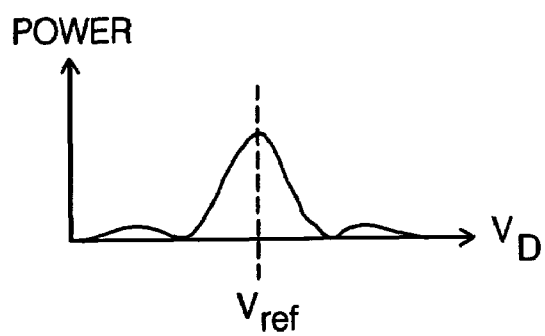
FIG. 1c is a graph plotting line voltage versus power consumption for the line receiver of FIG. 1b.

If $V_D$ is received by line receivers as shown in FIGS. 1b and 1c, the increased output impedance ideally shifts $V_D$ out of the range over which the line receiver's power consumption is greatest, thereby resulting in a further reduction in power dissipation. The non-zero value of $R_{add}$ should be chosen such that, when the drive circuit output is a logic '0', $V_D$ is low enough so that the power consumed by the line receivers coupled to the driven signal line is near zero; similarly, if the drive circuit output is a logic '1', $V_D$ should be high enough to avoid the voltage range for which the line receivers' power consumption is greatest. This can be achieved by choosing a small value for $R_{add}$. However, as shown above, the smaller the value of $R_{add}$ the larger the static power dissipation in the termination. Hence, a suitable median value needs to be chosen for $R_{add}$, based on system characteristics like line receiver power dissipation vs. signal line voltage, termination value, supply voltage and desired power savings.

The output impedance of drive circuit 36 may be made switchable by a wide variety of means. Several possible exemplary implementations are described below; however, other means by which the output impedance can be switched between a relatively low first value and at least one other value which is greater than the first value may also be acceptable.

Figure 3:
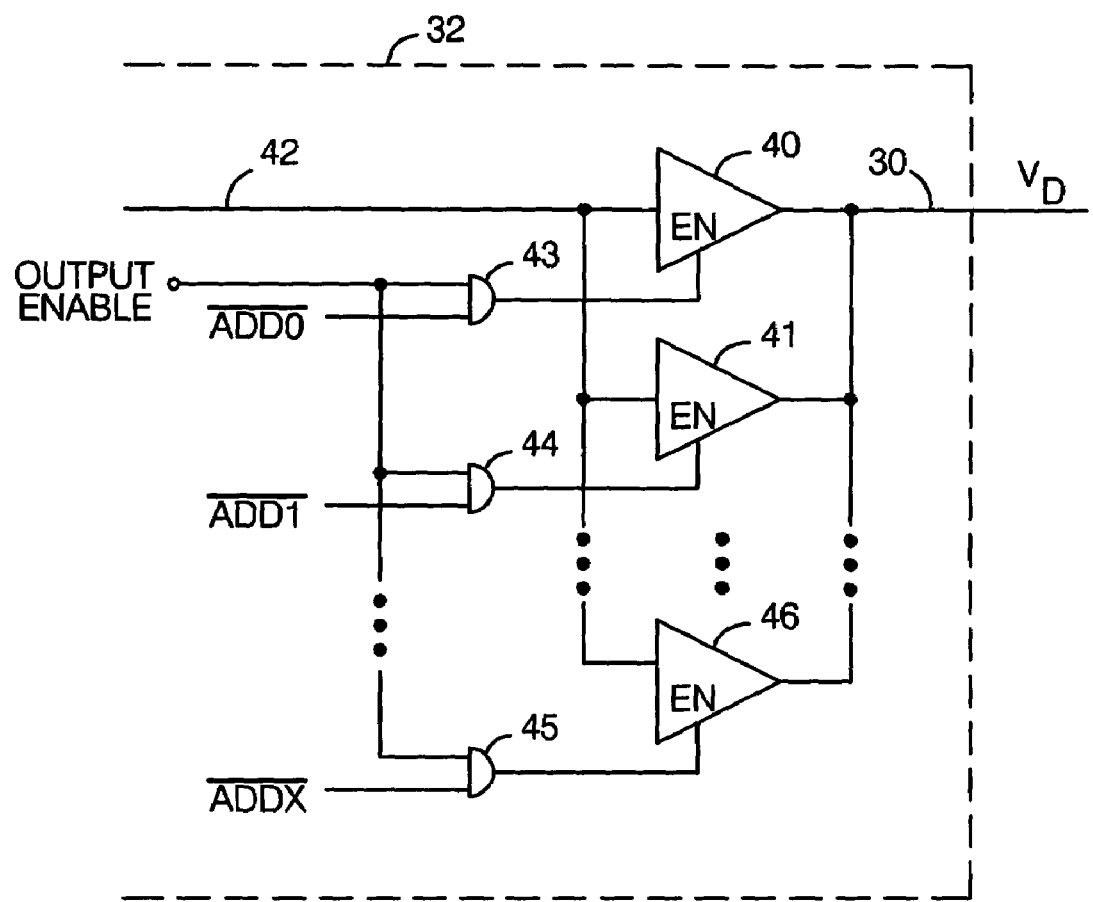
FIG. 3 is a schematic diagram of one possible implementation of an output buffer per the present invention.

One possible implementation for an output buffer per the present invention is shown in FIG. 3. Here, output buffer 32 contains at least two drive circuits (40, 41) connected in parallel. Each drive circuit receives the same input signal (42), and their outputs are tied together to provide a common output which drives signal line 30. The drive circuits are preferably activated in response to an "enable" signal (EN). In this approach, the overall output impedance for buffer 32 varies with the number of active drive circuits connected in parallel, with output impedance decreasing as more drive circuits are activated.

For the exemplary embodiment shown in FIG. 3, the output impedance is controlled by enabling a desired number of drive circuits. The output buffer would typically receive an "output enable" signal, which is logically combined with respective independent control signals ($\overline{ADD0}$, $\overline{ADD1}$)—here, using AND gates 43 and 44—to provide enable signals to respective driver circuits. Additional resolution for setting the buffer's output impedance could be obtained by connecting additional drive circuits (46) in parallel with drive circuits 40 and 41 and providing control signals ($\overline{ADDX}$ via AND gate 45) to their enable inputs as needed to achieve a desired output impedance. As the number of active parallel drive circuits (40,41,46) is increased, the output impedance decreases. A tri-state mode could be enabled by setting the "output enable" signal so that all the drive circuits are off.

Figure 4:
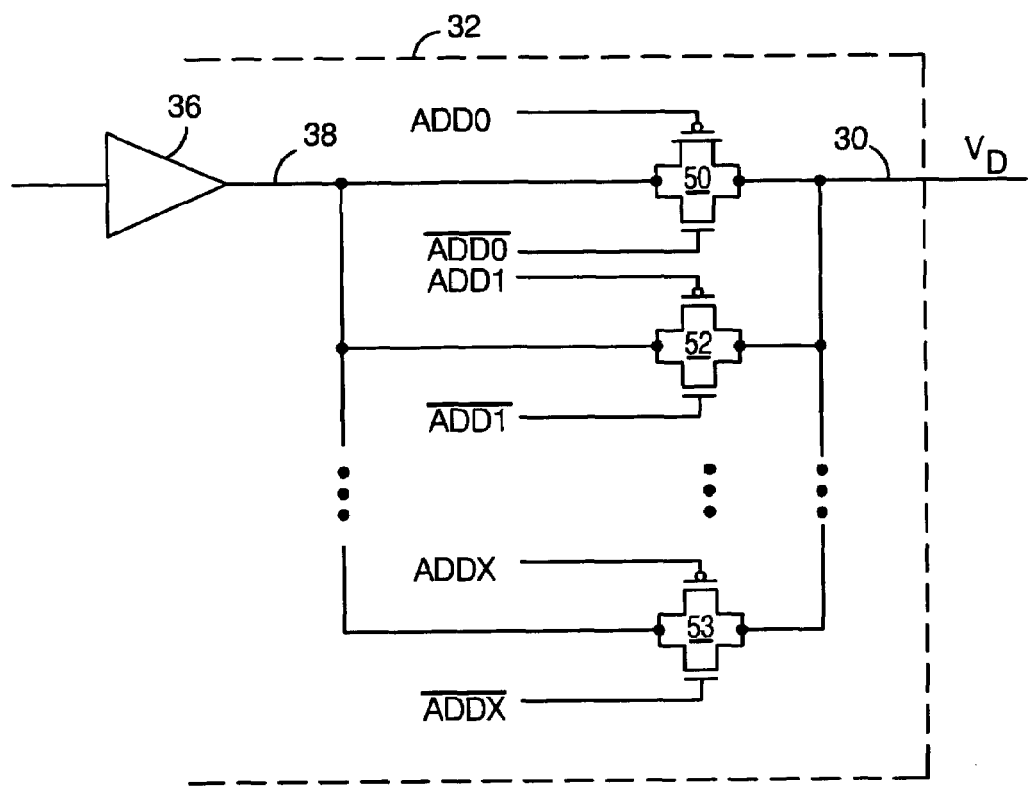
FIG. 4 is a schematic diagram of another possible implementation of an output buffer per the present invention.

Another possible implementation for an output buffer 32 per the present invention is shown in FIG. 4. Here, the means for switching the buffer's output impedance comprises at least two pass gates (50, 52) connected in parallel, with each pass gate input connected to receive the output 38 of drive circuit 36, and each pass gate output connected together to drive signal output line 30. When so arranged, the overall output impedance for buffer 32 varies with the number of 'on' pass gates, with output impedance decreasing as more pass gates are turned on. Each pass gate is controlled with a respective pair of control signals (ADD0, $\overline{ADD0}$; ADD1, $\overline{ADD1}$). Additional output impedance values could be achieved by connecting additional pass gates (53) in parallel with pass gates 50 and 52 and providing control signals (ADDX, $\overline{ADDX}$) to turn them on or off as needed to achieve a desired output impedance. A tri-state mode could be enabled by setting the control signals so that all the pass gates are off.

Figure 5:
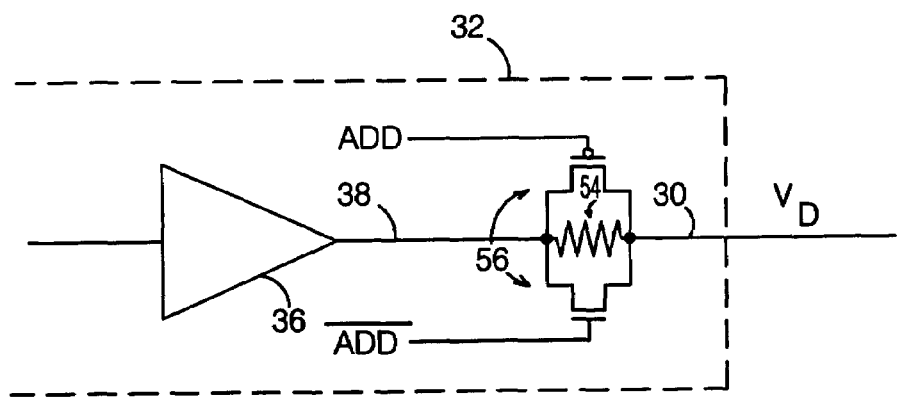
FIG. 5 is a schematic diagram of another possible implementation of an output buffer per the present invention.

Another possible embodiment is shown in FIG. 5. Here, a resistance 54 is connected in series with the output of drive circuit 36, and a switch is connected across the resistance. In FIG. 5, the switch is implemented with a pass gate 56, though other switch types could also be used. The resistance itself could be implemented by using a physical resistor or using transistors.

In 'normal' mode, the switch is closed, so that resistance 54 is effectively bypassed and the drive circuit's output impedance is relatively low. In 'standby' mode, the switch across resistance 54 is switched off, increasing the output impedance by an amount approximately equal to the value of resistance 54.

Further tunability of the output impedance could be achieved by connecting multiple switch/resistance pairs in series with the output of drive circuit 36, with each switch being independently controllable. Multiple pass gates could be used to realize such an implementation; note, however, that each pass gate adds capacitance which slows down the output signal.

Figure 6:
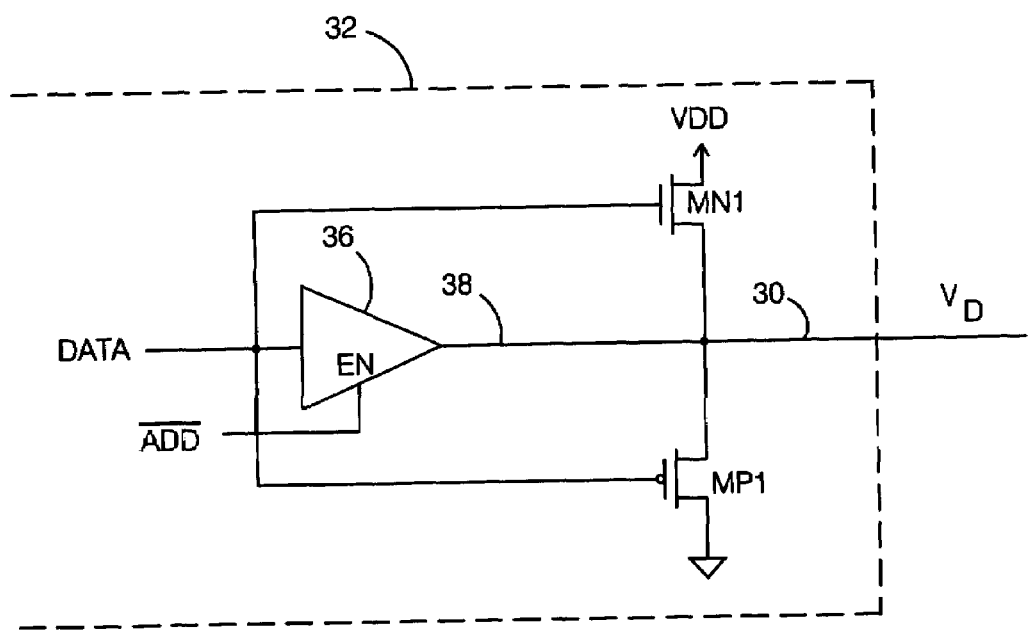
FIG. 6 is a schematic diagram of another possible implementation of an output buffer per the present invention.

Yet another possible implementation for an output buffer 32 per the present invention is shown in FIG. 6. Here, the means for switching the buffer's output impedance comprises an NMOS FET MN1 connected between the system's positive supply voltage $V_{DD}$ and signal output line 30, and a PMOS FET MP1 connected between the signal output line and circuit ground. The FETs are operated so as to effectively increase the output buffer's output impedance and to shift the signal line voltage during 'standby' mode. When implemented as shown in FIG. 6, during 'standby' mode ($\overline{ADD}$='low'), drive circuit 36 is disabled. If the data bit (DATA) is 'high', MP1 is turned off, and MN1 is turned on and pulls signal line 30 to a voltage given by $V_{DD}$-$V_{th}$, where $V_{th}$ is MN1's threshold voltage; MN1 presents a high output impedance to signal line 30. If DATA is 'low', MN1 is turned off, and MP1 is turned on and pulls signal line 30 to a voltage given by $V_{th}$, where $V_{th}$ is MP1's threshold voltage, again presenting a high output impedance to signal line 30.

Note that the methods shown in FIGS. 3, 4, 5 and 6 for controlling the output impedance switching means are merely exemplary. There are myriad ways in which these circuits could be realized, and many possible control schemes for operating them. It is only essential that the present output buffer include a drive circuit having an output adapted to drive a terminated signal line, and a means for switching the output impedance of the drive circuit between a relatively low 'normal' output impedance and a higher 'standby' output impedance, so as to reduce the power dissipation of the output buffer when operated in 'standby' mode.

Note that, though the schematics contained herein depict the use of field-effect transistors (FETs), bipolar transistors or other state-of-the-art current switching integrated circuit devices could also be used.

While particular embodiments of the invention have been shown and described, numerous variations and alternate embodiments will occur to those skilled in the art. Accordingly, it is intended that the invention be limited only in terms of the appended claims.

We claim:

1. An output buffer, comprising:
    a first drive circuit having an output adapted to drive a signal line terminated with a termination resistor; and
    a means for switching the output impedance of said first drive circuit between a first, relatively low output impedance when said output buffer is operated in a first mode and a second output impedance which is greater than said first output impedance when said output buffer is operated in a second mode, so as to reduce the power dissipation in said termination resistor when said output buffer is operated in said second mode;
    wherein said output buffer is connected between and powered by first supply voltage VDD and a second supply voltage, said means for switching the output impedance of said drive circuit comprising:
        an n-type transistor connected between $V_{DD}$ and said output; and
        a p-type transistor connected between said output and said second supply voltage;
    said buffer arranged to operate said transistors so as to increase the effective output impedance of said drive circuit when said output buffer is operated in said second mode.

2. The output buffer of claim 1, wherein said output buffer buffers a data bit received at an input, said output buffer arranged such that, when operated in said second mode, said p-type transistor is turned off and said n-type transistor is turned on when said data bit is 'high' such that said output is pulled to a voltage given by $V_{DD}$-$V_{th}$, and said n-type transistor is turned off and said p-type transistor is turned on when said data bit is 'low' such that said output is pulled to $V_{th}$.

3. The output buffer of claim 2, wherein said output buffer is arranged such that it is disabled when operated in said second mode.

4. An output buffer, comprising:
    a first drive circuit having an output adapted to drive a signal line terminated with a termination resistor; and
    a means for switching the output impedance of said first drive circuit between a first, relatively low output impedance when said output buffer is operated in a first mode and a second output impedance which is greater than said first output impedance when said output buffer is operated in a second mode, so as to reduce the power dissipation in said termination resistor when said output buffer is operated in said second mode;
    wherein said output buffer is contained within an address register which contains a plurality of said output buffers, said buffers arranged to provide respective output signals which drive respective signal lines, at least some of which are connected to the address or control inputs of respective random-access memory (RAM) chips residing on a Dual-Inline Memory Module (DIMM), and
    wherein said RAM chips include respective receivers for each of said address or control inputs, each of said receivers coupled to a respective one of said signal lines and having an associated power consumption which is greatest when the voltage on said signal line is within a known range, said means for switching the output impedance of said drive circuit arranged to ensure that the voltage on said signal line is outside of said known range when said output buffer is operated in said second mode.

5. The output buffer of claim 4, wherein said second output impedance is selected such that, when said output buffer is operated in said second mode, the voltage on said signal line is below said known range when said buffer's output is 'low' and such that the voltage on said signal line is above said known range when said buffer's output is 'high'.

6. An output buffer, comprising:
    a first drive circuit having an output adapted to drive a signal line terminated with a termination resistor; and
    a means for switching the output impedance of said first drive circuit between a first, relatively low output impedance when said output buffer is operated in a first mode and a second output impedance which is greater than said first output impedance when said output buffer is operated in a second mode, so as to reduce the power dissipation in said termination resistor when said output buffer is operated in said second mode;

wherein said means for switching the output impedance of said first drive circuit comprises:

a first switch/resistance pair, comprising:

a resistance which is connected in series with said drive circuit output; and a switch connected across said resistance which is opened and closed in response to a control signal, said switch closed in said first mode such that a relatively low output impedance is presented to said signal line, and said switch opened in said second mode such that an output impedance approximately equal to said resistance is presented to said signal line.

7. The output buffer of claim 6, wherein said switch is a pass gate.

8. The output buffer of claim 6, wherein said means for switching the output impedance comprises at least one additional switch/resistance pair connected in series with said first switch/resistance pair, said switches opened and closed in response to respective control signals to present a desired output impedance to said signal line.

9. A memory system, comprising:

a plurality of signal lines which route signals from respective output buffers to the address or control inputs of a plurality of random-access memory (RAM) chips residing on a Dual-Inline Memory Module (DIMM), said RAM chips including respective receivers for each of said address or control inputs, each of said receivers coupled to a respective one of said signal lines and having an associated power consumption which is greatest when the voltage on said signal line is within a known range; and a plurality of termination resistors connected between a fixed voltage and respective ones of said signal lines to terminate said signal lines;

each of said output buffers comprising:

a drive circuit having an output connected to drive a respective one of said terminated signal lines; and a means for switching the output impedance of said drive circuit between a first, relatively low output impedance when said output buffer is operated in a first mode and a second output impedance which is greater than said first output impedance when said output buffer is operated in a second mode so as to reduce the power dissipation in said termination resistor and to ensure that the voltage on said signal line is outside of said known range when said output buffer is operated in said second mode.

10. The memory system of claim 9, wherein said DIMM is part of a DDR3 memory system, said signal lines terminated in accordance with applicable JEDEC specifications.

11. The memory system of claim 9, wherein said means for switching the output impedance of said drive circuit comprises a resistance which is connected in series with said drive circuit output in response to at least one control signal.

* * * * *